United States Patent [19]

Averill

[11] Patent Number: 5,295,080
[45] Date of Patent: Mar. 15, 1994

[54] METHOD OF OPERATING A BUFFER MEMORY TO PROVIDE A TRIGGER PATTERN BY STORING A TRIGGER CODE IN PRESELECTED AREAS OF THE BUFFER MEMORY

[75] Inventor: Edward E. Averill, Beaverton, Oreg.

[73] Assignee: Tektronix, Inc., Wilsonville, Oreg.

[21] Appl. No.: 563,592

[22] Filed: Aug. 6, 1990

[51] Int. Cl.⁵ .......................................... G01R 13/00
[52] U.S. Cl. .................................. 364/487; 395/164; 395/166
[58] Field of Search .................. 364/DIG. 1, DIG. 2, 364/487; 395/117, 166, 164, 400, 425

[56] References Cited

U.S. PATENT DOCUMENTS

| | | | |
|---|---|---|---|
| 4,093,995 | 6/1978 | Smith et al. | 340/750 |
| 4,093,996 | 6/1978 | Hogan et al. | 364/487 |
| 4,495,585 | 1/1985 | Buckley | 364/487 |
| 4,743,844 | 5/1988 | Odenheimer et al. | 364/487 |
| 4,940,931 | 7/1990 | Katayama et al. | 364/487 |
| 5,039,937 | 8/1991 | Mandt et al. | 364/487 |

OTHER PUBLICATIONS

Kane, G., "The CRT Controller Handbook", 1980, pp. 1–23.

*Primary Examiner*—Paul V. Kulik
*Assistant Examiner*—John C. Loomis
*Attorney, Agent, or Firm*—Francis I. Gray

[57] ABSTRACT

Selected memory locations of a buffer memory having an m x n address space are loaded each with a trigger code. First and second data words, in bits and n bits respectively, are used to read the numerical value stored at a memory location of the buffer memory. If the numerical value bears a predetermined relationship to the trigger code, a predetermined response signal is generated.

7 Claims, 1 Drawing Sheet

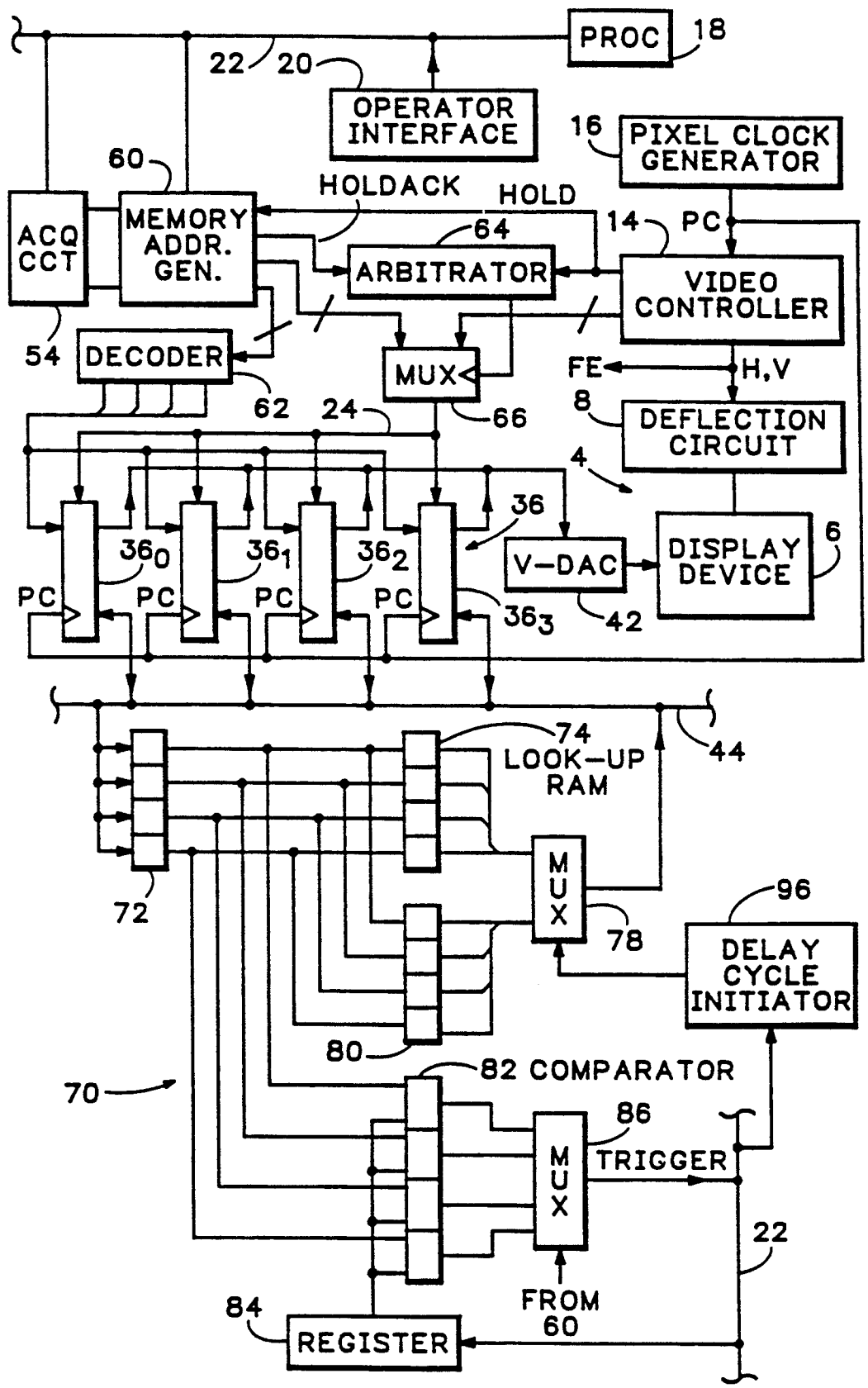

METHOD OF OPERATING A BUFFER MEMORY TO PROVIDE A TRIGGER PATTERN BY STORING A TRIGGER CODE IN PRESELECTED AREAS OF THE BUFFER MEMORY

BACKGROUND OF THE INVENTION

This invention relates to a method of operating a buffer memory to provide a trigger pattern.

A buffer memory is a random access memory having memory locations that map to map to displayable pixels of an imaging device. For example, a buffer memory may be used to store a virtual image of a display that is to be provided on a cathode ray tube (CRT) display device of a rasterscan oscilloscope. In this case, the pixels of the imaging device are addressed in accordance with a raster-scan pattern and the contents of the buffer memory are used to determine the intensity with which each pixel of the display device is illuminated.

An oscilloscope is conventionally used to display a waveform representative of change of a first variable as a function of a second variable. It will be convenient in the following description to assume from time to time that the first variable is the magnitude of a measured quantity and that the second variable is time, so that the waveform represents magnitude of the measured quantity as a function of time, but it will be understood that the second variable need not be time or even related to time. In a known rasterscan oscilloscope, waveform data composed of a stream of pairs of related data words is acquired. One word of each pair represents the value of a first variable and the other word of the pair represents the value of a second variable. Typically, the first variable is the magnitude of a sample of a signal existing at a test point and the second variable is the time at which the sample was taken. The range of values of the first variable is transformed so that it is the same as the range of the address space of the oscilloscope's display device along the vertical deflection axis, and the range of values of the second variable is transformed so that it is the same as the range of the address space of the display device along the horizontal deflection axis. Each pair of related data words in the waveform data then defines a discrete location in the address space of the display device. For each such pair, the content of the corresponding memory location of the buffer memory is read, incremented and written back to the same memory location. A display of the contents of the buffer memory illustrates graphically the function that relates the first variable to the second variable, and the relative intensities of the pixels represents the relative frequencies of occurrence of the various events defined by the pairs of related digital words.

U.S. Pat. No. 4,510,571 (Dagostino et al) discloses a vector digital oscilloscope having an acquisition waveform memory into which sample values are loaded in linear fashion and a reference waveform memory in which sample values representing a reference waveform are stored. The waveform record stored in the acquisition waveform memory is compared with the waveform record stored in the reference waveform memory, and when a deviation from the reference waveform, beyond a predetermined tolerance, is detected in a newly acquired waveform, a record of the new waveform is stored in a changed waveform memory.

It is known to test waveform data representing signal magnitude as a function of time to determine whether the signal magnitude falls within an envelope by storing pairs of minimum and maximum values associated with the sample times respectively. When a new sample value is acquired, it is compared with the maximum and minimum values for the sample time. Typically, if the new sample value is not between the minimum and maximum values, a trigger is generated to initiate termination of the signal acquisition.

This type of envelope testing is subject to disadvantage since it is limited to a single pair of minimum and maximum values for each sample time and therefore is applicable only to single-valued waveforms. It is necessary to perform memory access operations to read the minimum and maximum values and carry out the comparison.

A generalization of envelope testing is accomplished by defining polygons in a display space and converting each polygon into an envelope of min-max pairs. As each sample value is processed, it is compared to an envelope data base. If the data point is within the X-extent of an envelope, and is between the minimum and maximum values of Y for that X point of the envelope, a trigger is generated. This envelope testing procedure requires several steps to determine if a single data point justifies a trigger.

SUMMARY OF THE INVENTION

In accordance with a first aspect of the present invention, a method of operating a buffer memory that comprises an array of memory locations defined by an n-bit address word and an m-bit address word, each memory location being capable of storing a numerical value composed of at least two bits, comprises the steps of loading selected memory locations of the buffer memory each with a trigger code, receiving a first data word of n-bits and a second data word of m-bits, reading from the buffer memory the numerical value stored at the memory location whose address is defined by the first and second data words, and if the numerical value read in the preceding step bears a predetermined relationship to said trigger code, generating a predetermined response signal.

In accordance with a second aspect of the invention, a method of operating a buffer memory that comprises a multiplicity of memory locations in an address space having a first dimension and a second dimension, each memory location being capable of storing a numerical value composed of at least two bits, comprises the steps of:

(a) loading the memory locations within a selected area of the address space each with a trigger code, (b) acquiring a succession of pairs of data words each composed of a first data word and a second data word, the range of the first data word being equal to at least the range of the first dimension of the address space and the range of the second data word being equal to at least the range of the second dimension of the address space, (c) for each pair of data words, (i) reading from the buffer memory the numerical value stored at the memory location whose address in the first dimension of the address space is defined by an address word related in a predetermined fashion to the first data word and whose address in the second dimension of the address space is defined by an address word related in a predetermined fashion to the second data word, (ii) comparing said numerical value with said trigger code, and
(iii) if said numerical value bears a predetermined relationship to said trigger code, generating a predetermined response signal, and
(iv) otherwise incrementing said numerical value by a predetermined amount and writing the incremented numerical value to the memory location that was read in step (c) (i),
(d) subsequently generating pairs of first and second address words, and
(e) for each pair of address words
(i) reading from the buffer memory the numerical value stored at the memory location defined by the first and second address words, and
(ii) if said numerical value bears a predetermined relationship to said trigger code, writing the numerical value unchanged back to the memory location read in step (e) (i), and
(iii) otherwise decrementing the numerical value by a selected amount and writing the decremented numerical value back to the memory location read in step (e) (i).

In accordance with a third aspect of the invention, buffer memory apparatus comprises a multiplicity of memory locations occupying a two-dimensional address space and each capable of storing a numerical value composed of at least two bits, means for defining an area of the address space and loading the memory locations within the defined area each with a trigger code, input means for receiving a succession of pairs of data words each composed of a first data word and a second data word, means responsive to a pair of data words received by the input means to read from the buffer memory the numerical value stored at the memory location whose address is defined by a first address word related in a predetermined fashion to the first data word and a second address word related in a predetermined fashion to the second data word, compare the numerical value read from the buffer memory with said trigger code, and if said numerical value bears a predetermined relationship to said trigger code, generate a predetermined response signal.

BRIEF DESCRIPTION OF THE DRAWING

For a better understanding of the invention, and to show how the same may be carried into effect, reference will now be made, by way of example, to the accompanying drawing the single FIGURE of which is a schematic diagram of a raster-scan digital oscilloscope embodying the present invention.

In order to avoid cluttering the drawing, components that are not helpful in understanding the invention have not been illustrated.

DETAILED DESCRIPTION

The illustrated oscilloscope 2 comprises a CRT display device 4 having a display screen 6 and a deflection circuit 8. Oscilloscope 2 operates under control of a precessor 18, which causes the oscilloscope to execute various operations. Processor 18 communicates with other components of the oscilloscope over a system bus 22. An operator of the oscilloscope is able to adjust various settings of the oscilloscope through an operator interface 20. Oscilloscope 2 also comprises a video controller 14 that operates in response to a pixel clock signal PC generated by a pixel clock generator 16 and generates horizontal and vertical sync pulses H and V.

Video controller 16 also generates a frame end signal FE synchronously with the vertical sync pulse V.

The sync pulses are applied to deflection circuit 8, which generates horizontal and vertical deflection signals that cause the electron beam of the CRT to be deflected over the screen of the CRT in a horizontal raster pattern composed of 512 lines. During each horizontal line time, 512 pixel clock pulses are generated. In this manner, the display screen is divided into 262,144 pixels.

Oscilloscope 2 also comprises a dual-ported buffer memory 36 having 262,144 addressable memory locations. Memory 36 is composed of four segments $36_0$, $36_1$, $36_2$ and $36_3$ each organized as 512 rows containing 128 locations, and each memory location is able to store a four-bit numerical value. Memory 36 has a parallel port connected to a data bus 44 and a serial port connected to a video digital-to-analog converter (V-DAC) 42.

At the beginning of each horizontal scanline retrace, video controller 14 initiates a display refresh cycle. During this cycle, the video controller applies a HOLD signal to a memory address generator 60 and to an address bus arbitrator 64. Arbitrator 64 controls the state of an address bus multiplexer 66, which has one state in which it selects video controller 14 and another state in which it selects memory address generator 60. Memory address generator 60 acknowledges the HOLD signal by issuing a HOLDACK signal to bus arbitrator 64. Arbitrator 64 responds to the HOLD and HOLDACK signals by placing multiplexer 66 in the state in which it selects video controller 14. Video controller 14 places a nine-bit row address, corresponding to the next scanline to be displayed, on address bus 24. In this fashion, one row of memory locations in each segment of memory 36 is selected. The contents of the 128 memory locations in the selected row of each segment are shifted to an internal shift register of the memory segment. Memory segments $36_0$, $36_1$, $36_2$ and $36_3$ are selected in repetitive sequence in response to successive pixel clock pulses during the active interval of the horizontal scanline, and as each segment is selected the contents of its internal shift register are shifted out through the serial port. Thus, the values shifted through the serial port are in the sequence $36_0$, $36_1$, $36_2$, $36_3$, $36_0$, $36_1$ and so on, and are synchronized with deflection of the electron beam under control of the deflection signals generated by deflection circuit 8. The sequence of numerical values read out from memory 36 is converted into an analog intensity signal by V-DAC 42. The intensity signal is used to control the intensities with which the pixels on one line of the raster are illuminated. Thus, the addressable memory locations of buffer memory 36 map on a one-to-one basis to displayable pixels on CRT screen 6 and are scanned synchronously with the scanning of display screen 6 by the electron beam of display device 4. The intensity with which a given pixel is illuminated in the display refresh cycle depends on the numerical value stored in the corresponding memory location. Since the numerical values stored in buffer memory 36 each have four bits, display device 4 is able to display 16 intensity levels (off and 15 gray levels).

Oscilloscope 2 comprises an acquisition circuit 54 that provides waveform data, comprising pairs of digital words. One word of each pair represents the value of a first parameter and the other word of the pair represents the value of a second parameter. The waveform data pairs are applied to a memory address generator 60. In response to each waveform data pair, and scale and offset signals received from operator interface 20, memory address generator 60 generates a nine-bit Y address word and a nine-bit X address word. If video controller 14 requires access to bus 24, memory address generator 60 temporarily stores the X and Y address words. When video controller 14 no longer requires access to bus 24, for example during the vertical retrace interval, arbitrator 64 places multiplexer 66 in the state in which it selects memory address generator 60, and memory address generator 60 applies the Y address word and the upper seven bits of the X address word to multiplexed address bus 24 as a 16-bit memory address vector. Address bus 24 is eight bits wide, and therefore the memory address vector is supplied in two words of eight bits each, one word being composed of the upper eight bits of the Y address and the other of the X address and the LSB of the Y address. Memory address generator 60 applies the two LSBs of the X address word to a decoder 62, which decodes the two LSBs of the X address word into one of four binary values.

Before carrying out a signal acquisition, the operator defines a trigger region in the address space of display device 4. The trigger region may constitute one or more closed figures, in which case the trigger region may be defined by using the operator interface to move the cursor of the oscilloscope around the boundary of each closed figure. Processor 18, acting through buses 22 and 44, loads a trigger code into the memory locations corresponding to the pixels touched by the cursor when defining the boundary. For each value of Y in the address space of the display device at which two pixels are touched by the cursor, processor 18 also loads the trigger code into all memory locations corresponding to the pixels between those two touched pixels. Alternatively, the trigger region may be the region outside a closed figure, in which case the locations corresponding to the pixels that are inside the boundary of the closed figure can be identified in the manner described above and the trigger code can be loaded into all memory locations corresponding to the pixels other than those inside the boundary. Processor 18 also loads the trigger code into a register 84. It will be understood that since memory 36 is in four segments, in general the trigger region of the display address space will correspond to four trigger regions in the address spaces of the memory segments respectively.

During a signal acquisition, buffer memory 36 operates in a read, modify, write mode. The numerical values stored at the four memory locations, identified by a memory address vector applied to bus 24 by memory address generator 60, are read from the buffer memory and are placed on the data bus 44. A pixel manipulator 70 reads the numerical values from the data bus and loads them into a latch 72. Latch 72 applies the numerical values read from bus 44 to the address lines of a look-up RAM 74 whose data lines are connected to one input of a multiplexer 78. Look-up RAM 74 returns four output values, related to the four input values respectively by a look-up table stored in RAM 74, and these modified values are placed on the data bus by multiplexer 78. On the basis of the two LSBs of the X address word generated by memory address generator 60, decoder 62 applies a write enable signal to one of the four segments of memory 36, and the appropriate one of the four modified values is written back into the appropriate segment of the buffer memory 36. The contents of the corresponding memory locations in the other three segments of memory 36 remain unchanged.

During the acquisition, the values read from buffer memory 36 are also applied to a comparator 82, which compares each value with the trigger code stored in register 84. If one of the values read from buffer memory 36 is equal to the trigger code, the corresponding output of the comparator is logical one, otherwise it is logical zero. The "equal to" outputs of comparator 82 are connected to a multiplexer 86, which receives at its control input the two LSBs of the X address word generated by memory address generator 60 and selects the input that represents the result of comparison of the trigger code to the content of the memory location that is being updated. Thus, if the memory location that is being updated corresponds to a pixel inside the trigger region, multiplexer 86 provides a logical one at its output and otherwise provides a logical zero at its output. The output of multiplexer 86 is applied to processor 18, which may respond to a logical one received from multiplexer 86 by issuing a trigger to acquisition circuit 54 to initiate termination of the acquisition.

The look-up table stored in RAM 74 is loaded into the look-up RAM by main processor 18. In order to prevent issue of spurious triggers, the look-up table is such that no location that contains the trigger code will be changed. For example, if the trigger code is decimal 2, the look-up table may be such that RAM 74 returns the values indicated in the right column of Table I in response to the input values indicated in the left column of Table I.

TABLE I

| Address | Data |
|---------|------|
| 0 | 1 |
| 1 | 3 |
| 2 | 2 |
| 3 | 4 |
| 4 | 5 |
| . | . |
| . | . |
| . | . |
| 14 | 15 |
| 15 | 15 |

Pixel manipulator 70 also comprises a decrementer, which enables oscilloscope 2 to emulate the persistence mode of operation of an analog oscilloscope. When emulating the persistence mode, oscilloscope 2 from time to time executes a decay cycle in response to a signal provided by a decay cycle initiator 96. During a decay step, memory address generator 60 generates a memory address vector internally and the contents of the four memory locations identified by that memory address vector are applied through latch 72 to the decrementer. In the case of the illustrated embodiment of the invention, the decrementer comprises a second look-up RAM 80, whose data lines are connected to the second input of multiplexer 78. Look-up RAM 80 returns four output values, related to the input values respectively by the look-up table stored in RAM 80, and these modified values are placed on the data bus by multiplexer 78 and are written back into the appropriate memory locations of memory 36. After each read, modify, write cycle, memory address generator 60 generates a new memory address vector. In order to reduce intensity pumping effects, the memory address vectors generated in successive decay steps point to locations that are staggered over the address space of memory 36. In a decay cycle, which constitutes a succession of decay steps, all memory locations containing non-zero values are decremented.

In a decay cycle, the contents of the memory locations corresponding to pixels outside the trigger region are decremented, so that the pixels progressively fade unless the corresponding memory locations are incremented, in acquisition cycles, at least as rapidly as they are decremented in decay cycles.

In a decay cycle, it is not necessary to test the numbers loaded into latch 72 to determine whether a memory location containing the trigger code has been addressed, but it is necessary to ensure that locations that have been loaded with the trigger code are not modified. If the trigger code is decimal 2, this may be accomplished by loading decay RAM 80 with a table such that it provides as output the value indicated in the right column of Table II in response to the input indicated in the left column of Table II.

TABLE II

| Address | Data |
|---------|------|
| 0 | 0 |
| 1 | 0 |
| 2 | 2 |
| 3 | 1 |
| 4 | 3 |
| . | . |
| . | . |
| . | . |
| 14 | 13 |
| 15 | 14 |

The value of decimal 2 for the trigger code is chosen because it is sufficient to enable the trigger region to be easily discerned by the operator of the oscilloscope.

It will be appreciated that the invention is not restricted to the particular embodiment that has been described, and that variations may be made therein without departing from the scope of the invention as defined in the appended claims and equivalents thereof. For example, it is not essential to use two separate look-up RAMs for the pixel update cycle and the decay cycle, since the update table and the decay table may be loaded into a single RAM in alternating fashion. However, use of two separate RAMs frees the system from timing and other constraints, imposed by using a single look-up RAM for the two functions. Further, it is not necessary to employ look-up tables for the update and decay operations, since these operations may be performed by use of arithmetic logic units functioning as adders and subtractors respectively, provided that steps are taken to avoid altering the input values that are equal to the trigger code. This may be accomplished on the update side by a look-up RAM loaded with a table that returns the same output value for a given input value except in the case where the input value, provided by the adder, corresponds to the value that is returned by the adder in response to the trigger code, in which case the table returns the trigger code. A similar expedient may be employed on the decay side. An advantage of using an arithmetic logic unit for updating is that it facilitates the display of intensified zones, as described in abandoned patent application Ser. No. 07/563,774 filed Aug. 6, 1990 and use of an arithmetic logic unit for decay facilitates adaptive operation of the decay function, as described in co-pending patent application Ser. No. 07/563,656 filed Aug. 6, 1990. It is not essential that the number of memory locations be equal to the number of displayable pixels, so long as there are at least as many memory locations as displayable pixels.

Further information regarding functions that can be performed using the same general architecture shown in the drawing is contained in patent application Ser. No. 07/149,792 filed Jan. 29, 1988 and in abandoned patent application Ser. No. 07/445,138 filed Dec. 4, 1989. The disclosure of all four applications mentioned above is hereby incorporated by reference herein.

I claim:

1. A method of operating a buffer memory to generate a trigger when a waveform in the form of pairs of data words falls outside a defined region, the buffer memory having an array of memory locations defined by first and second address words, each memory location storing a numerical value, said method comprising the steps of:
   (a) loading selected memory locations of the buffer memory corresponding to the defined region with a trigger code,
   (b) receiving a first data word and a second data word from each pair of data words,
   (c) reading from the buffer memory the numerical value stored at the memory location whose first and second address words are defined by the first and second data words, and
   (d) generating the trigger when the numerical value read in step (c) bears a predetermined relationship to said trigger code.

2. The method according to claim 1 further comprising the steps of:
   incrementing the numerical value read in step (c) by a selected amount when the numerical value does not bear said predetermined relationship to said trigger code, and
   writing the incremented numerical value back to the memory location that was read in step (c).

3. The method according to claim 1 further comprising the steps of:
   (e) reading the numerical value from each memory location of the buffer memory,
   (f) decrementing each numerical value that does not bear the predetermined relationship to the trigger code by a selected amount, and
   (g) writing the decremented numerical values back to the respective memory locations.

4. The method according to claim 1 wherein the buffer memory has at least two coextensive arrays of memory locations, the locations of each array being defined by the first and second address words, and step (b) comprises the steps of:
   (b)(i) acquiring the first and second data words from an input signal, and
   (b)(ii) employing the first data word and the upper m bits of the second data word to determine the first and second address words to select a memory location in each of said coextensive arrays,
   step (c) comprises the step of reading the numerical values from the selected memory location in each array, and
   step (d) comprises the steps of:
   (d)(i) comparing the numerical values from the selected memory locations with the trigger code, and
   (d)(ii) employing the lower p bits of the second data word to select one of the results of the comparing step to determine whether said trigger should be generated.

5. A method of operating a buffer memory that has a multiplicity of memory locations in an address space having a first dimension and a second dimension, each memory location storing a numerical value, said method comprising the steps of:

(a) loading the memory locations within a selected area of the address space with a trigger code, (b) acquiring a succession of pairs of data words from an input signal, each pair being composed of a first data word and a second data word, the range of the first data word being equal to at least the range of the first dimension of the address space and the range of the second data word being equal to at least the range of the second dimension of the address space, (c) for each pair of data words, (i) reading from the buffer memory the numerical value stored at the memory location whose address in the first dimension of the address space is defined by a first address word and whose address in the second dimension of the address space is defined by a second address word, the first and second address words being related in a predetermined fashion to the first and second data words, (ii) comparing said numerical value with said trigger code, (iii) generating a predetermined response signal when said numerical value bears a predetermined relationship to said trigger code, and (iv) incrementing said numerical value by a predetermined amount and writing the incremented numerical value to the memory location that was read in step (c)(i) when said numerical value does not bear the predetermined relationship to said trigger code, (d) subsequently generating the first and second address words independently of the first and second data words, and (e) for the first and second address words (i) reading from the buffer memory the numerical value stored at the memory location defined by the first and second address words, (ii) writing the numerical value unchanged back to the memory location read in step (e)(i) when said numerical value bears the predetermined relationship to said trigger code, and (iii) decrementing the numerical value by a selected amount and writing the decremented numerical value back to the memory location read in step (e)(i) when said numerical value does not bear the predetermined relationship to said trigger code.

6. The method according to claim 5 further comprising before step (a) the step of defining said selected area of the address space.

7. Buffer memory apparatus for generating a trigger when a waveform in the form of pairs of data words falls outside a defined region comprising:

a multiplicity of memory locations occupying a two-dimensional address space and each storing a numerical value, means for defining an area of the address space corresponding to the defined region and loading the memory locations within the defined area each with a trigger code, means for receiving the pairs of data words, each pair having a first data word and a second data word, means responsive to each pair of data words from the receiving means for reading from the buffer memory the numerical value stored at the memory location whose address is defined by a first address word and a second address word related in a predetermined fashion to the first and second data words, comparing the numerical value read from the buffer memory with said trigger code, and generating the trigger when said numerical value bears a predetermined relationship to said trigger code.

* * * * *